United States Patent
Goldbach et al.

(10) Patent No.: US 6,806,037 B2
(45) Date of Patent: Oct. 19, 2004

(54) METHOD FOR PRODUCING AND/OR RENEWING AN ETCHING MASK

(75) Inventors: Matthias Goldbach, Dresden (DE); Thomas Hecht, Dresden (DE); Bernhard Sell, Dresden (DE)

(73) Assignee: Infineon Technologies AG, Munich (DE)

( * ) Notice: Subject to any disclaimer, the term of this patent is extended or adjusted under 35 U.S.C. 154(b) by 149 days.

(21) Appl. No.: 10/167,785

(22) Filed: Jun. 12, 2002

(65) Prior Publication Data

US 2002/0185468 A1 Dec. 12, 2002

(30) Foreign Application Priority Data

Jun. 12, 2001 (DE) .......................... 101 28 481

(51) Int. Cl.$^7$ ................................. G03F 7/26
(52) U.S. Cl. ................ 430/314; 430/313; 430/316; 430/318; 216/41; 216/47
(58) Field of Search ................. 430/311, 312, 430/313, 314, 316, 317, 318; 216/41, 47

(56) References Cited

U.S. PATENT DOCUMENTS

| | | | |
|---|---|---|---|
| 5,935,763 A | 8/1999 | Caterer et al. | 430/313 |
| 5,945,255 A | 8/1999 | King | 430/311 |
| 5,952,156 A * | 9/1999 | Chin et al. | 430/316 |

FOREIGN PATENT DOCUMENTS

EP   0 083 397 A2   7/1983

* cited by examiner

Primary Examiner—Kathleen Duda
(74) Attorney, Agent, or Firm—Laurence A. Greenberg; Werner H. Stemer; Ralph E. Locher

(57) ABSTRACT

An etching mask is produced for etching a substrate by a photoresist layer being exposed such that areas which are exposed once are not yet completely exposed and, on the basis of a reflective layer which is located under the photoresist layer, additionally exposed areas are exposed completely. In consequence, a first etching mask which is used for etching a substrate can be renewed by a second etching mask in that a photoresist layer which is applied to the first etching mask or instead of the first etching mask is exposed such that areas which have been exposed once are not yet completely exposed, and areas which have been additionally exposed on the basis of a reflective layer which is located under the photoresist layer and corresponds to the first etching mask are exposed completely.

18 Claims, 4 Drawing Sheets

METHOD FOR PRODUCING AND/OR RENEWING AN ETCHING MASK

BACKGROUND OF THE INVENTION

Field of the Invention

The invention relates to a method for etching a substrate by means of a first etching mask, which comprises a first photoresist layer, with the etching process being interrupted before the first etching mask is applied, and the first etching mask being renewed by a second etching mask. The invention furthermore relates in general form to a method for producing an etching mask for etching a substrate.

The etching of a substrate, in particular the fabrication of deep trenches in a substrate, for example in silicon, is becoming ever more demanding with regard to the substrate etching, for example silicon etching, as the aspect ratio increases. Complex integration schemes are required for this purpose, which always have to provide a sufficiently thick etching mask. That is to say, the etching mask must be chosen such that it has not yet been completely consumed after production of the desired structure. The mask is generally a hard mask and must be deposited and opened in an appropriate manner. The opening process must in its own right in turn be carried out with an additional mask. All of this results in considerable complexity.

An oxide mask is generally used for silicon etching, and can in turn be opened using a silicon mask. That combination can be continued, but the resulting costs are very high.

SUMMARY OF THE INVENTION

It is accordingly an object of the invention to provide an improved method for producing an etching mask for etching a substrate, and, furthermore, of specifying an improved method for etching a substrate with a mask combination which can be continued, which overcomes the above-mentioned disadvantages of the heretofore-known devices and methods of this general type and which allows substrate etching to be carried out more cost-effectively.

With the foregoing and other objects in view there is provided, in accordance with the invention, a method for etching a substrate, which comprises:

etching the substrate with a first etching mask;

producing a second etching mask for renewing the first etching mask by applying a second photoresist layer on the first etching mask or instead of the first etching mask and a reflective layer underneath corresponding to the first etching mask; and illuminating the second photoresist layer such that areas that have been exposed once are not completely exposed, and areas that have been additionally exposed due to the reflective layer located under the second photoresist layer are exposed completely.

With the above and other objects in view there is also provided, in accordance with the invention, a method of producing an etching mask for etching a substrate, which comprises exposing a photoresist layer such that areas that have been exposed once are not yet completely exposed and that areas that have been additionally exposed due to a reflective layer located under the photoresist layer, are completely exposed.

The novel method is especially suitable in an etching process in which at least one layer that is deposited over a trench is etched to make contact with an opening of the trench, wherein the reflective layer is applied as a cover for the trench in a layer disposed under the at least one layer.

The method is also suitable, in a preferred implementation, for renewing an etching mask.

In summary, the objects of the invention are achieved by the above-outlined method for producing an etching mask for etching a substrate and, furthermore, by a method of the generic type for etching a substrate.

According to the invention, in order to etch a substrate, a first etching mask which comprises a first photoresist layer is used after a first, advantageously short, structuring of the substrate together with a reflective substrate, in order repeatedly to renew the etching mask for the substrate by means of a second photoresist layer. The use of a reflective substrate means that only the first etching mask need be structured, for example with a reticle, after which only a single, preferably homogenous, exposure with preferably parallel light is carried out in order to renew the first etching mask by means of the second photoresist layer, since the photoresist of the second photoresist layer has the characteristic of not yet being sufficiently exposed when illuminated once with the corresponding light, but of being exposed by additional illumination on the basis of the light which is reflected by the reflective layer. A negative photoresist is preferably used for the second photoresist layer. In this case, the renewed etching mask corresponds, after being developed, 1:1 to the originally used etching mask.

As specified in a further independent claim, the basic idea on which the invention is based, of producing an etching mask on the basis of information which is available in or on the substrate to be etched, in this case an appropriately structured reflective layer, can also be used in a general form, without the restriction to renewing a first etching mask.

In this case—as implemented in a specific embodiment, structures which are buried in the substrate can advantageously be exposed again 1:1 onto the substrate surface, without any need for complicated optical alignment of a reticle. A positive photoresist is advantageously used for this purpose, whose area which is exposed twice and which corresponds to the buried structure provided with the reflective layer is removed in a subsequent development process, as a result of which an etching mask which is suitable for reproduction of the buried structure and which corresponds to the etching mask used to produce the buried structure is produced in a simple manner.

In comparison with the prior art, the invention achieves, in particular, the advantages that even deep etching depths can be achieved for deep etching processes without the use of expensive hard masks, the use of which is in some cases problematic, since the etching mask can be renewed as often as required, and structures which are buried in the substrate can be imaged 1:1 onto the substrate surface, for example the wafer surface.

Owing to the capability to "store" the information which is required for renewing or reproduction of the etching mask by means of a reflective layer when the etching mask is first used, that is to say during the first structuring of the substrate, by the previous structuring of the reflective layer, and to produce a reflective layer in a structure before, for example, epitaxial silicon is grown on it, the use of appropriate photoresist provides a very simple and cost-effective capability to avoid complex renewing and reproduction, which are subject to errors, of an etching mask with reticles.

With the above and other objects in view there is thus provided, in accordance with the invention, a method for etching a substrate, which comprises:

a) applying a reflective layer to the substrate;
b) applying a first photoresist layer to the reflective layer;
c) producing an etching pattern on the first photoresist layer and developing the first photoresist layer to form the first etching mask;
d) etching the reflective layer with the first etching mask;
e) etching the substrate with the first etching mask;
f) interrupting the etching process before the first etching mask formed by the first photoresist layer or before the reflective layer is consumed;
g) applying a second photoresist layer;
h) exposing the substrate coated with the second photoresist layer, such that areas which have been exposed once are not yet completely exposed and areas of the second photoresist layer which have been additionally exposed due to the reflective layer are exposed completely;
developing the second photoresist layer to form a second etching mask corresponding to the first etching mask; and
repeating the sequence, starting with the etching of the coated substrate but with the second etching mask, until a desired structure depth is achieved in the substrate.

In other words, after the final developing step the sequence is repeated, starting with the etching of the coated substrate but now using the second etching mask, that is to say starting with the step e), until a desired structure depth is achieved in the substrate.

If the etching process which is provided for the first structuring or at least for structuring of the reflective layer is interrupted before the first etching mask, which is formed by the first photoresist layer, is applied, it can also be removed before application of the second photoresist layer.

A protective layer is advantageously arranged between the reflective layer and the substrate to be etched, which protective layer in the case of a silicone substrate advantageously comprises a pad silicon dioxide layer which is applied directly to the silicon substrate, and a pad silicon nitride layer which is applied to the pad silicon dioxide layer and on which the reflective layer is applied. This protective layer is not necessary for the renewing or production of an etching mask according to the invention.

Furthermore, the photoresist which is used at least for the second photoresist layer advantageously does not have high absorption, in order that the difference between the single illumination process and the additional illumination process is as great as possible.

In accordance with an added feature of the invention, the reflective layer is composed of metal.

The exposure process is advantageously carried out according to the invention over the entire surface, homogeneously, using parallel light.

As stated above, a negative photoresist is advantageously used as a second photoresist for renewing a first etching mask, whose areas which have been exposed twice are used as a physical etching mask, that is to say they remain in place, after a development process.

If an etching mask composed of a positive photoresist is produced by means of the reflective layer in the above methods, then this etching mask has a structure which is the inverse of that of the reflective layer. This etching mask can be used, for example, to remove the reflective layer and, if appropriate, the protective layer located underneath it.

Other features which are considered as characteristic for the invention are set forth in the appended claims.

Although the invention is illustrated and described herein as embodied in a method for producing and/or renewing and etching mask, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
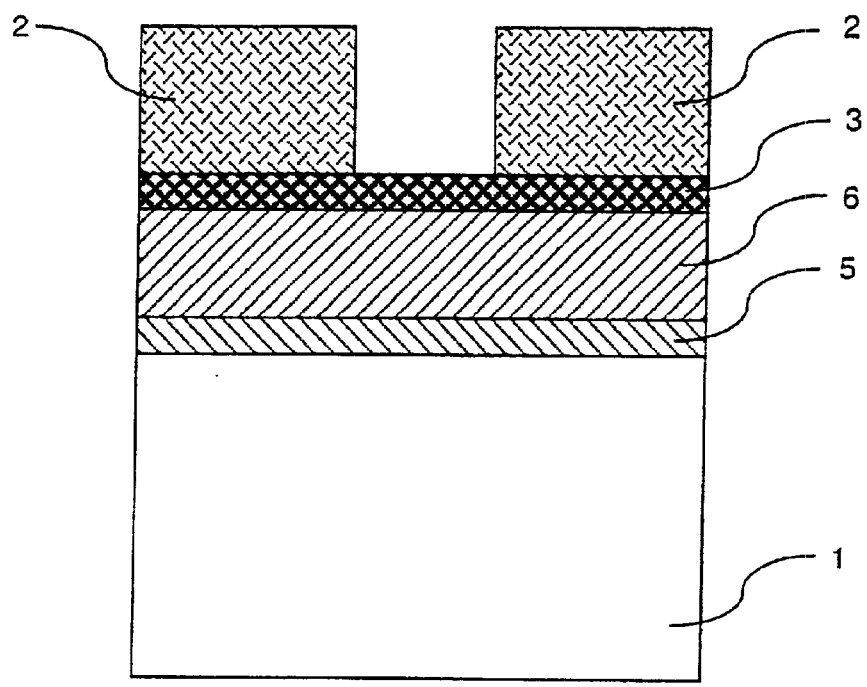
FIG. 1–FIG. 7 show various stages in the method according to the invention for etching of a substrate, with a first etching mask being renewed by a second etching mask.

Referring now to the figures of the drawing in detail and first, particularly, to FIG. 1 thereof, there is shown a substrate 1 to be etched having a first etching mask 2 which is structured, for example, photographically with a reticle. A reflective layer 3 is arranged between the etching mask 2 and the substrate 1. A protective layer 5, 6 is arranged between the reflective layer 3 and the substrate 1 and comprises a pad silicon dioxide layer 5, which is disposed directly on the substrate, and a pad silicon nitride layer 6, which is disposed directly on the pad silicon dioxide layer 5, and directly underneath the reflective layer 3.

Figure 2:
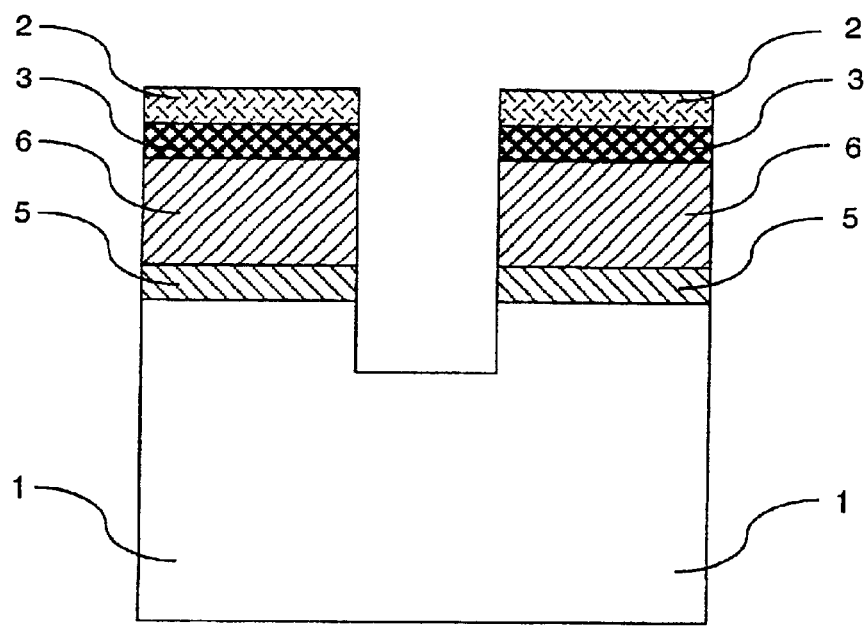

FIG. 2 shows a state of the coated substrate, as shown in FIG. 1, after a first etching process, which etches at least the reflective layer 3 and, preferably, the protective layers 6, 5 and, furthermore and optionally, a part of the silicon substrate 1. As can be seen from FIG. 2, both the reflective layer 3 and the protective layers 6, 5 as well as a part of the silicon substrate 1 have been etched. During this etching process, the first etching mask which is formed by a photoresist layer 2 is at least partially consumed as well, and its thickness is thus reduced, as is shown schematically in FIG. 2.

Figure 3:
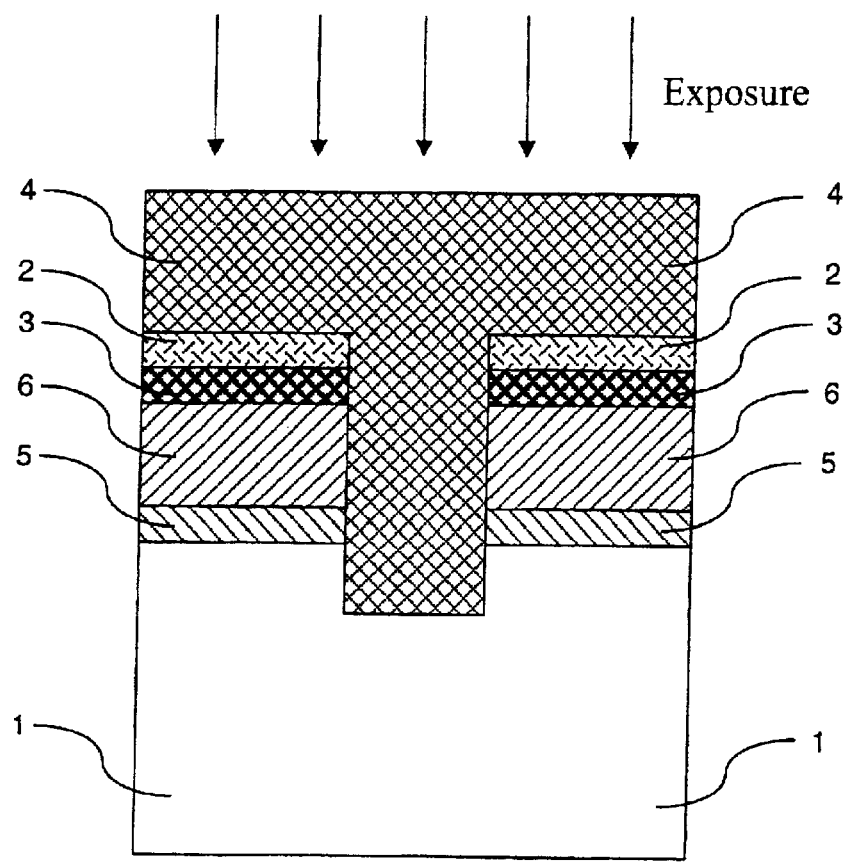

FIG. 3 shows a state of the coated and (briefly) structured substrate 1 with a negative photoresist 4 that has been applied, and which is exposed over the entire surface. The photoresist layer 4 is exposed completely, by virtue of the exposure process being more than single exposure, only at those points at which the reflective layer 3 is still present, where it remains after the development process. Optionally, the first etching mask, which is in this case formed by the first resist layer 2, can be removed before the application of the second resist layer 4.

Figure 4:
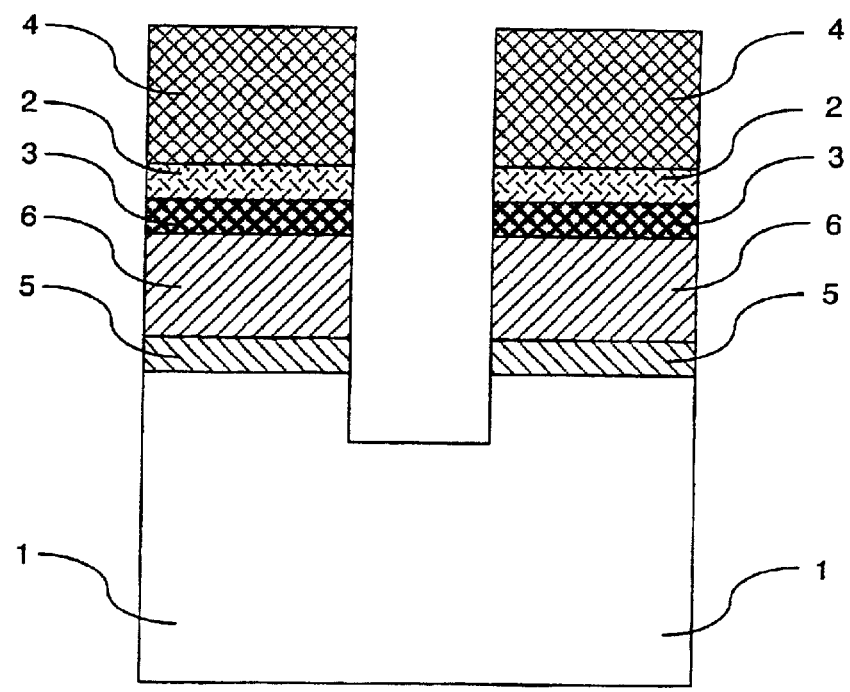

FIG. 4 shows the coated substrate 1, which is shown in FIG. 3, partially etched and provided with a second exposed resist layer 4, after the development of the second photoresist layer 4, that is to say before any further etching.

Figure 5:
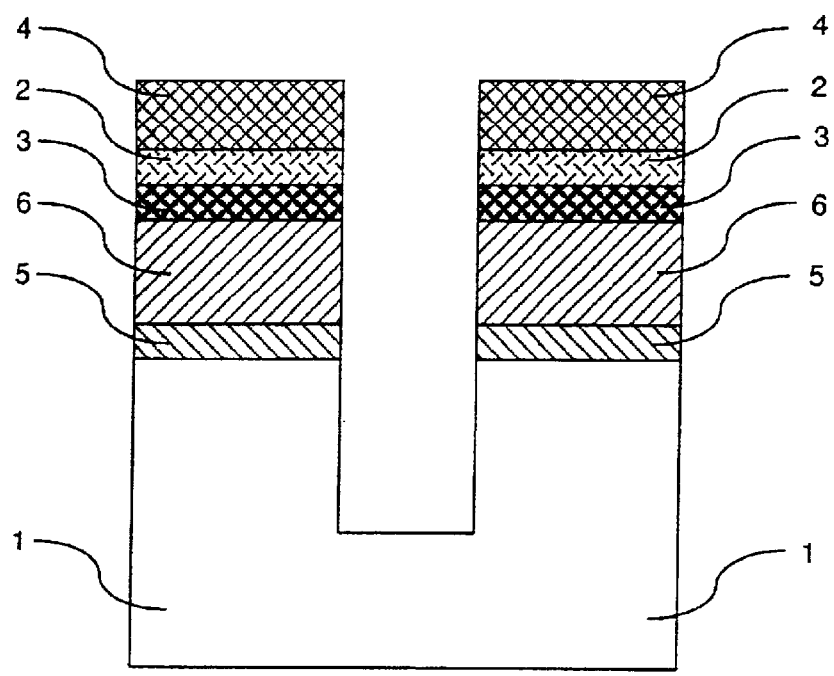
Figure 6:
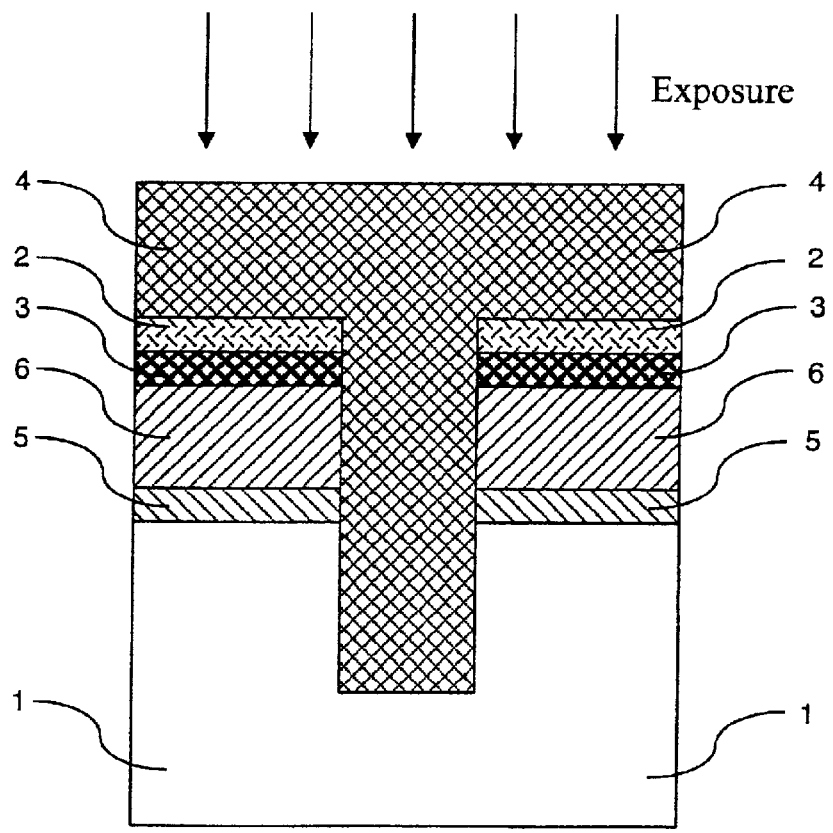
Figure 7:
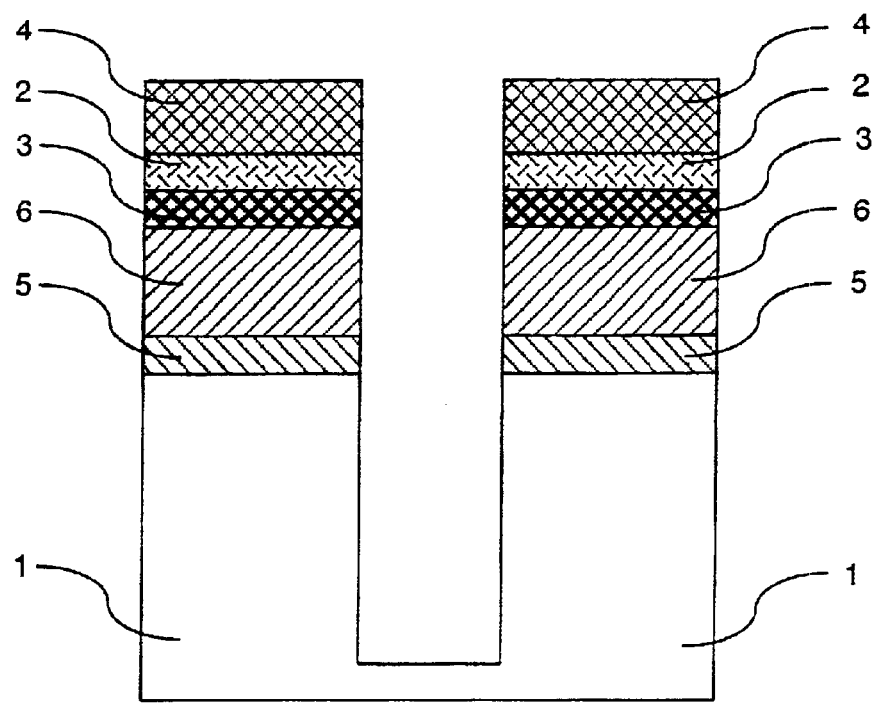

FIG. 5 shows the state after further substrate etching, after which, as is shown in FIGS. 6 and 7, renewed coating can be carried out with a further second resist layer 4, which may be exposed with further substrate etching, until the desired depth of the etching is achieved in the substrate 1.

Figure 8:
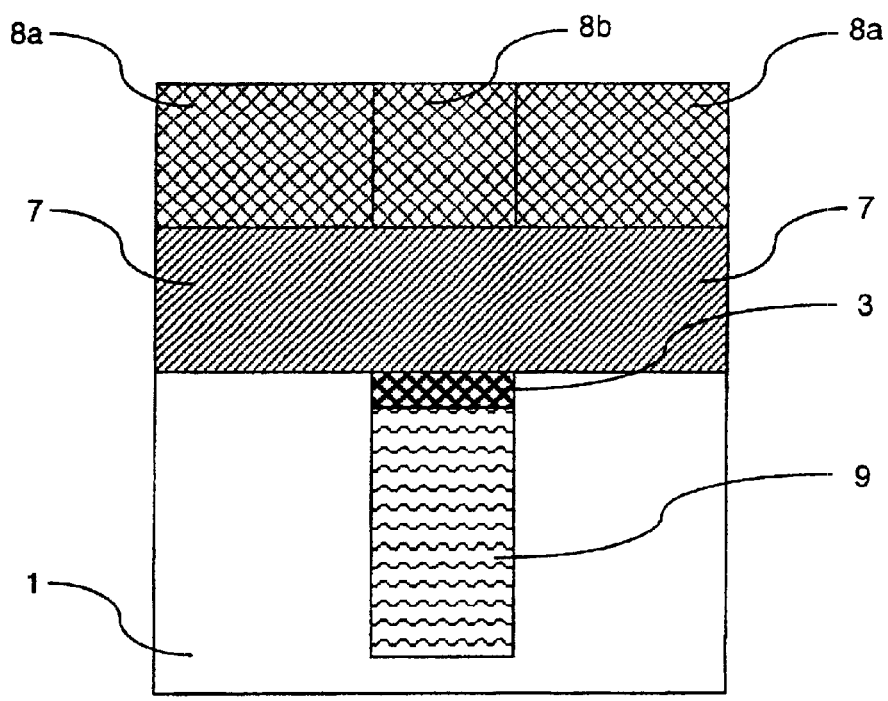
FIG. 8 shows an outline illustration to explain the method according to the invention, in order to expose structures which are buried in the substrate 1:1 again onto the substrate surface.

FIG. 8 shows the substrate 1 as shown in FIG. 7, wherein the etching mask which is formed by the second photoresist layer 4, the etching mask which is formed by the first photoresist layer 2, the reflective layer 3 and the protective layer 6, 5 are removed, wherein the trench shown in FIG. 7 is provided with a filling material 9, for example polysilicon, with a reflective layer 3 arranged on it, which arrangement is provided with a deposited layer 7, for example with an epitaxial silicon being grown over it, and then having been coated with a photoresist layer 8. After the entire surface of this photoresist layer 8, which is in this case in the form of a positive photoresist, has been exposed, areas 8a which have been exposed once and an area 8b which has been additionally exposed owing to the reflective layer 3 are produced. After development of the photoresist layer 8, this area 8b which is located above the trench in the substrate 1 is removed, and the trench can be exposed (made contact with) by etching the deposited layer 7. The positive photoresist layer 8 can be renewed in an analogous manner to the above description, given with respect to FIGS. 1 to 7, for renewing the etching mask 2.

According to the already described exemplary embodiment of this invention, a reflective layer 3, preferably a metal, is applied to the substrate 1 after a protective layer on the substrate, for example silicon, such as pad silicon dioxide and pad silicon nitride. After a first lithographic structuring process, the transfer of the structure to the metal, and to the protective layer 5, 6 located underneath it, a first structuring process can also be carried out on the substrate 1. Before the etching mask which is used for this first structuring process is consumed completely, the structuring of the substrate 1 is interrupted, and a layer of negative photoresist is applied. Only the one reflective layer 3 must, of course, necessarily remain. The photoresist which is used must have the characteristic that a single exposure with the appropriate light does not in itself produce sufficient exposure, although an additional exposure is provided by the reflective layer 3. Resists which do not have high absorption are most suitable for this purpose, so that the intensity of the reflective light is attenuated only slightly. The entire surface is now exposed homogeneously, using parallel light. In the areas wherein the reflective layer 3 is present, the photoresist layer 4 is exposed and illuminated to a correspondingly greater extent. The subsequent development of the negative resist 4 thus removes only those areas which do not have a reflective layer 3, while the photoresist 4 remains in the areas under which there is no reflective material 3. This resist will now serve once again as an etching mask for the substrate 1. This method, of coating with resist, of exposure and of development, can now be performed repeatedly, depending on the etching depth to be achieved.

We claim:

1. A method for etching a substrate, which comprises:
applying a reflective layer on the substrate;
producing on the reflective layer a first etching mask formed of a patterned and developed first photoresist layer;
etching the substrate through the reflective layer with the first etching mask;
interrupting the etching process before the first etching mask or before the reflective layer is consumed;
producing a second etching mask for renewing the first etching mask by
applying a second photoresist layer on the first etching mask or replacing the first etching mask by the second photoresist layer on the reflective layer; and
exposing the second photoresist layer such that areas that have been exposed once are not completely exposed, and areas that have been additionally exposed due to the reflective layer underneath are exposed completely.

2. The method according to claim 1, which comprises removing the first etching mask prior to applying the second photoresist layer.

3. The method according to claim 1, which comprises applying a protective layer on the substrate to be etched, prior to applying the reflective layer.

4. The method according to claim 3, wherein the substrate to be etched is a silicon substrate and the protective layer is formed in two layers from a pad silicon dioxide layer applied directly to the silicon substrate, and from a pad silicon nitride layer applied on the pad silicon dioxide layer.

5. The method according to claim 1, which comprises forming the reflective layer from metal.

6. The method according to claim 1, which comprises exposing in a homogenous exposure over an entire surface and with parallel light.

7. The method according to claim 1, wherein a negative photoresist is used as the photoresist, in order to produce trenches in the substrate.

8. The method according to claim 1, which further comprises removing the second etching mask, the reflective layer, the first etching mask, and, if appropriate, removing the protective layer.

9. The method according to claim 1, which comprises providing the first or second photoresist layer from a photoresist that does not have high absorption.

10. A method for etching a substrate, which comprises:
a) applying a reflective layer to the substrate;
b) applying a first photoresist layer to the reflective layer;
c) producing an etching pattern on the first photoresist layer and developing the first photoresist layer to form the first etching mask;
d) etching the reflective layer with the first etching mask;
e) etching the substrate with the first etching mask;
f) interrupting the etching process before the first etching mask formed by the first photoresist layer or before the reflective layer is consumed;
g) applying a second photoresist layer;
h) exposing the substrate coated with the second photoresist layer, such that areas which have been exposed once are not yet completely exposed and areas of the second photoresist layer which have been additionally exposed due to the reflective layer are exposed completely;
i) developing the second photoresist layer to form a second etching mask corresponding to the first etching mask; and
optionally repeating the sequence, starting with the etching of the coated substrate but with the second etching mask, until a desired structure depth is achieved in the substrate.

11. The method according to claim 10, which comprises removing the first etching mask prior to applying the second photoresist layer.

12. The method according to claim 10, which comprises applying a protective layer on the substrate to be etched, prior to applying the reflective layer.

13. The method according to claim 12, wherein the substrate to be etched is a silicon substrate and the protective layer is formed in two layers from a pad silicon dioxide layer applied directly to the silicon substrate, and from a pad silicon nitride layer applied on the pad silicon dioxide layer.

14. The method according to claim 10, which comprises providing the first or second photoresist layer from a photoresist that does not have high absorption.

15. The method according to claim 10, which comprises forming the reflective layer from metal.

16. The method according to claim 10, which comprises exposing in a homogenous exposure over an entire surface and with parallel light.

17. The method according to claim 10, wherein a negative photoresist is used as the photoresist, in order to produce trenches in the substrate.

18. The method according to claim 10, which which further comprises removing the second etching mask, the reflective layer, the first etching mask and, if appropriate, removing the protective layer.

* * * * *